United States Patent [19]
Finley et al.

[11] Patent Number: 5,552,180
[45] Date of Patent: Sep. 3, 1996

[54] MULTILAYER HEAT PROCESSABLE VACUUM COATINGS WITH METALLIC PROPERTIES

[75] Inventors: James J. Finley, O'Hara Township; Mehran Arbab, Pittsburgh; Thomas J. Waynar, New Kensington, all of Pa.

[73] Assignee: PPG Industries, Inc., Pittsburgh, Pa.

[21] Appl. No.: 471,662

[22] Filed: Jun. 6, 1995

Related U.S. Application Data

[62] Division of Ser. No. 799,806, Nov. 29, 1991.

[51] Int. Cl.⁶ .................................................. B05D 5/06
[52] U.S. Cl. ........................ 427/165; 427/166; 427/167; 427/376.2; 427/419.7; 204/192.27; 204/192.28
[58] Field of Search .................................. 427/165, 166, 427/167, 376.2, 419.7; 204/192.27, 192.28

[56] References Cited

U.S. PATENT DOCUMENTS

| | | | |
|---|---|---|---|
| 4,112,142 | 9/1978 | Schroder et al. | 427/66 |
| 4,114,983 | 9/1978 | Maffitt et al. | 350/164 |
| 4,450,201 | 5/1984 | Brill et al. | 428/336 |
| 4,847,157 | 7/1989 | Goodman et al. | 428/426 |
| 4,900,630 | 2/1990 | Suzuki et al. | 428/432 |
| 4,990,234 | 2/1991 | Szczyrbowski et al. | 204/192.23 |
| 4,992,087 | 2/1991 | Holscher | 65/60.2 |
| 4,995,895 | 2/1991 | Groth et al. | 65/60.2 |

FOREIGN PATENT DOCUMENTS

| | | | |
|---|---|---|---|
| 550365 | 9/1956 | Belgium. | |
| 2080065 | 7/1991 | China | C03C 17/36 |
| 0226993 | 7/1987 | European Pat. Off. | C03C 17/36 |
| 0239280 | 9/1987 | European Pat. Off. | C03C 17/34 |
| 0281894 | 9/1988 | European Pat. Off. | C03C 17/36 |
| 0301755 | 2/1989 | European Pat. Off. | C03C 17/00 |
| 60-141647 | 7/1985 | Japan | C03C 17/22 |
| 63-242948 | 10/1988 | Japan | C03C 17/36 |
| 3-187955 | 8/1991 | Japan | C03C 17/34 |
| 2201428 | 9/1988 | United Kingdom | C23C 14/14 |

OTHER PUBLICATIONS

Valkonen et al., "Selective Transmission of Thin TiN-films", *SPIE Int. Soc. Opt. Eng.*, 1983, pp. 375–380.

Chemical Abstracts, vol. 111. No. 2, 10 Jul. 1989, Columbus, Ohio, US; abstract No. 11542q, p. 271; JP 63–242,948.

Chemical Abstracts, vol. 114, No. 18, 6 May 1991, Columbus, Ohio, US; abstract No. 169829k, p. 346; JP 02–233, 534.

*Primary Examiner*—Benjamin Utech
*Attorney, Agent, or Firm*—Donald C. Lepiane

[57] ABSTRACT

A temperable coated article with metallic properties is prepared by coating a glass substrate with a metal-containing film such as titanium nitride, which ordinarily oxidizes at high temperature, overcoating with a protective layer of a silicon compound which forms a durable layer and prevents oxidation of the underlying metal-containing film and undercoating with a stabilizing metal-containing layer. The coated article can be tempered without losing its metallic properties to oxidation.

26 Claims, 2 Drawing Sheets

MULTILAYER HEAT PROCESSABLE VACUUM COATINGS WITH METALLIC PROPERTIES

This is a division of application Ser. No. 07/799,806, filed Nov. 29, 1991 pending.

BACKGROUND

This invention relates generally to the art of vacuum coating, and more particularly to the art of producing vacuum coatings which maintain metallic properties throughout high temperature processes such as tempering.

Many metallic coatings vacuum deposited on glass lose their characteristic metallic properties when subjected to high temperature processing. Vacuum coatings with metallic properties such as conductivity and infrared reflectance are generally metals, metal nitrides, metal carbides or metal borides, which oxidize when heated in air to form metal oxides which are electrically insulating, more transparent and less absorbing. While many metals can be heated in air to the forming temperature of glass (600° to 700° C.) and develop a protective oxide surface layer, the thinness of transparent metallic coatings and their consequent non-bulk, even porous, nature prevent the formation of a suitable protective layer. Thus thin transparent metallic films generally cannot be heated to temperatures at which glass can be bent without degradation of metallic properties.

U.S. Pat. No. 4,992,087 to Holscher discloses a process for the production of a tempered or bent glass plate with a transmission-reducing coating in which to one side of the glass plate is applied at least one opaque metal coating predominantly at least one metal or alloy of elements 22 to 28, and a metal-containing protective coating of an alloy of aluminum and at least 10 atomic percent titanium and/or zirconium and thickness selected such that during tempering or bending there is no significant oxygen diffusion to the metal coating.

U.S. application Ser. No. 07/768,791 entitled "HEAT PROCESSABLE METALLIC VACUUM COATINGS" filed Sep. 30, 1991, by Gillery discloses that vacuum coatings with a metallic appearance as deposited can be made to retain their metallic appearance upon bending by overcoating with a different metal which forms a dense oxide, and that further improvement in oxidation resistance of the metallic film can be attained by introducing additional interfaces formed by another layer of a different material, particularly an amorphous metal oxide.

A titanium nitride coating has metallic properties that make it suitable for a durable solar control coating. By changing the coating thickness, the transmission and solar properties can be varied, and by adding the appropriate combination of dielectric layers, reflectance and color can be varied while maintaining chemical and mechanical durability.

Such coated articles have particular application in monolithic automotive glazing. When the coating is deposited on a dark substrate such as Solargray® glass it can be used for privacy glazing with enhanced solar properties and a desired reflectance and color. On clear glass the titanium nitride layer can be adjusted to allow for greater than 70 percent transmittance of Illuminant A (LTA) with low internal reflectances neutral appearance and enhanced solar properties. However most vehicle transparencies are bent and tempered.

In order to use titanium nitride on a flat glass substrate which is subsequently bent and tempered, it has now been discovered that it must not only be protected from oxidation by means of a protective overcoat layer, but also must be stabilized, for example, against glass substrate-titanium nitride layer interaction or stress-induced "breakdown" which occur at the high temperatures required for tempering. For example, a coating of titanium initride/silicon nitride made by a magnetton sputtering process, where the silicon nitride overcoat prevents oxidation of the titanium nitride, was found not to survive tempering for silicon nitride layer thicknesses up to 800 Angstroms. Such a coating becomes hazy, mottled, crazed and develops a picture frame effect (coating breakdown around the edge of glass plate) after tempering. In addition, the coating is susceptible to glass surface contamination, such as packer belt marks, washer contamination in the form of streaks, or spots in the coating after heating.

SUMMARY OF THE INVENTION

Figure 1:
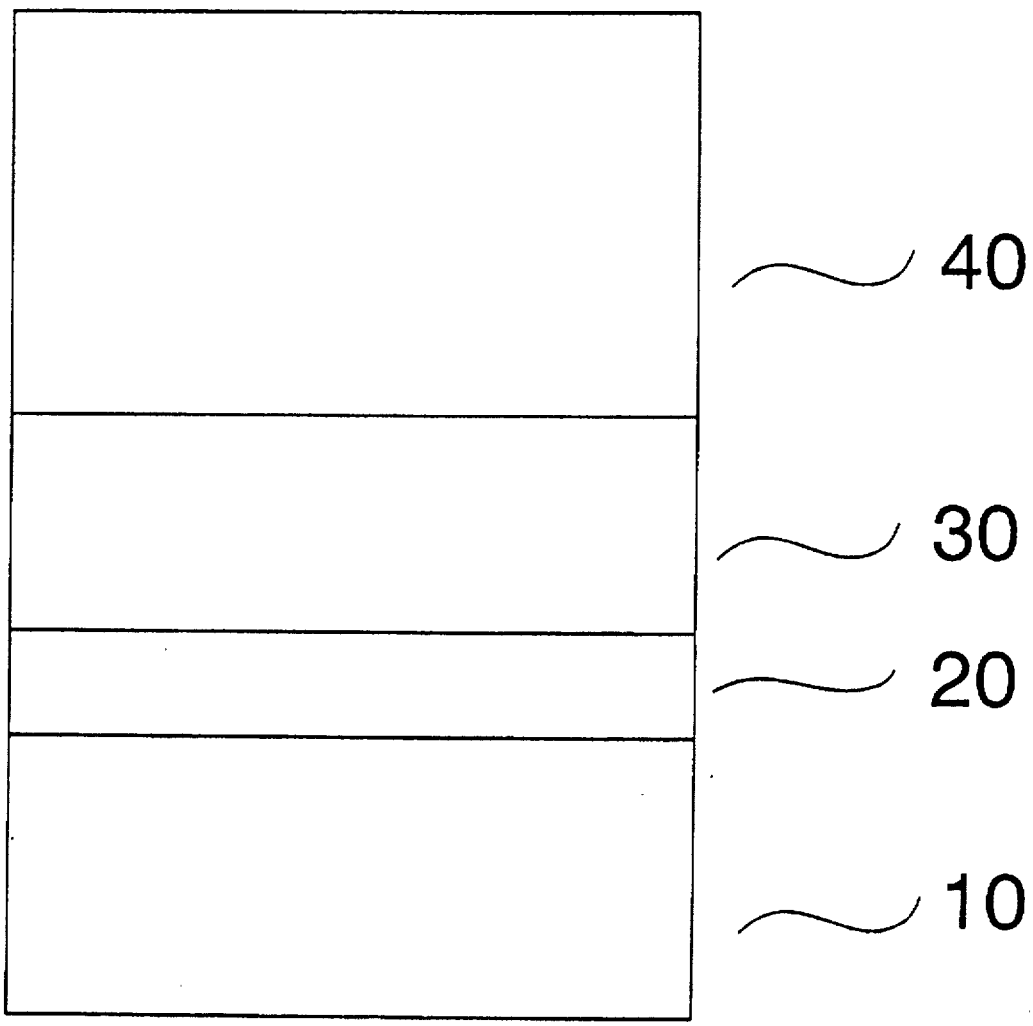
FIG. 1 illustrates the coated article of the present invention with substrate 10 coated with a first malleable metal-containing layer 20 which stabilizes a second metal compound layer 30 with metallic properties which in turn is protected from oxidation by a silicon-based dielectric layer 40.

Vacuum coatings of metal compounds having metallic properties, such as titanium nitride, retain their metallic properties when overcoated with a dielectric material, and are stabilized for tempering by the addition of a malleable metal, alloy or semiconductor layers below the titanium nitride. Such an underlayer, which has a thermal expansion coefficient equal to or less than that of the substrate, has good adhesion to the glass substrate and titanium nitride layer, eliminates the problems of haze, mottle, picture framing and surface contamination, and greatly increases the operating temperature range for tempering. Preferred underlayer materials include silicon, titanium, zirconium, tantalum, chromium, niobium, silicon alloys and nickel-chromium alloys.

DESCRIPTION OF PREFERRED EMBODIMENTS

In accordance with the present invention, oxidation resistant metallic metal compound coatings, particularly titantum nitrtde, which nevertheless normally oxidize readily at 700° C., can be protected from such oxidation by dielectric oxides or nitrides if a stabilizing layer is deposited below the titanium nitride layer as well. These stabilizing layers should have good adhesion to the adjacent layers, be somewhat malleable and have thermal expansion coefficients less than or equal to glass. The preferred stabilizing layers are silicon and silicon alloys, titanium, zirconium, tantalum, chromium, niobium, nickel-chromium and nickel-chromium containing alloys. Aluminum nitride can also be used as a stabilizing layer, particularly to maintain high transmittance. Silicon-aluminum as a stabilizing layer results in higher total solar energy transmittance (TSET) values than silicon-nickel and aluminum nitride for the same value of luminous transmittance of Illuminant A (LTA).

The stabilizing layer isolates the glass substrate from and provides a uniform controlled surface for the metallic metal compound layer. During the thermal process it prevents, for example, the titanium nitride layer from reacting with the glass surface and provides a mechanical transitional layer between the glass substrate and the titanium nitride layer. The stabilizing layer reacts with the glass surface forming an oxide, thus increasing in transmission, and still maintains bonding to the metallic metal compound. The stabilizing layer should be thick enough to isolate the metallic metal compound layer from the glass, yet thin enough to oxidize and provide maximum transmission, since this layer does not significantly enhance solar properties. The thickness of the stabilizing layer is preferably in the range of 5 to 100 Angstroms. A preferred stabilizing layer is silicon, preferably in the thickness range of 20 to 50 Angstroms. Titanium is another preferred stabilizing layer, particularly in the thickness range of 15 to 40 Angstroms.

Silicon alloy dielectrics are preferred for overcoats in accordance with the present invention. The silicon alloy dielectric used for the overcoat is critical in preventing coating breakdown during heating. Silicon can be alloyed or doped with many different elements. Each element adds some unique property to the silicon, either in the form of a target material for sputter deposition or in the form of a sputtered coating. In addition, target fabrication, either by casting or plasma spraying, is facilitated by alloying. In accordance with the present invention elements alloyed or doped with silicon include aluminum, nickel, chromium, iron, nickel-chromium alloys, boron, titanium and zirconium. The amount of other metal alloyed with silicon varies by metal and is limited only by the desired properties of the target and the coating. Typically up to 50 percent by weight of additional metal in silicon is usable, preferably 5 to 25 percent alloying metal and/or up to 2 percent dopant.

Sputtering a planar target of silicon-nickel, for example, is more stable, with a 40 percent higher sputtering rate than sputtering a planar target of silicon-aluminum in an oxygen-argon gas mixture, and the effect of 20 weight percent nickel on absorption and refractive index of an oxide coating is insignificant for the applications described here. Silicon-nickel, however, when sputtered as a nitride is absorbing, the degree depending on the amount of nickel, where silicon-aluminum nitride is not. When index variation or absorption are desirable, for example with a privacy type coating, the alloy content can be varied. This gives the added flexibility of an additional layer to vary optical properties and particularly to decrease transmission. Chromium and chromium-nickel alloys behave similarly to nickel, with added chemical durability, particularly for the nitride coating. Silicon-aluminum nitride, on the other hand, is not as chemically durable.

Generally, silicon alloy oxide, nitride and oxynitride coatings all provide durable overcoats which assist in preventing oxidation of the underlying metallic metal compound layers during a tempering process. Silicon-iron is most effective with an additional layer over the metallic metal compound. In addition, the process of heating during tempering further enhances the chemical and mechanical durability of these layers. A silicon-aluminum or silicon-nickel nitride, oxide or oxynitride overcoat, for example, is particularly effective. A silicon-iron nitride is most effective with an intermediate silicon-aluminum nitride, aluminum nitride, silicon or silicon alloy layer between the titanium nitride and silicon-iron nitride layers. Silicon alloy oxide protective overcoats are particularly effective in the range of 400 to 1100 Angstoms, preferably 500 to 1000 Angstroms, thick, while silicon alloy nitride protective overcoats are particularly effective in the range of 125 to 1000, preferably 200 to 800 Angstrome thick.

Generally, for solar control glazing in automobiles, coating stacks typically consist of titanium nitride sandwiched between dielectric layers to form an interference coating stack and provide a protective overcoat. In accordance with the present invention, a stabilizing metal layer is inserted between the glass substrate and a layer of a metal compound with metallic properties. A preferred metal compound is titanium nitride, typically at a thickness of 20 to 1000 Angstroms, preferably at a thickness of 30 to 500 Angstroms. The metal compound layer is protected from oxidation by an overcoat of a dielectric material, preferably a silicon-based dielectric material. The coating is then stable in a bending or tempering, process. The combination of these layers and the thermal processing enhance the properties of the coating. The solar properties of this tempered or bent coated glass with the stabilizing metal layer, titanium nitride and silicon alloy dielectric material are always superior to the equivalent unheated coating with no stabilizing layer. Preferred silicon-based dielectric materials are the oxides, nitrides and oxynitrides of siicon and silicon alloys containing, e.g. aluminum, nickel and/or chromium.

The silicon alloy oxide overcoat layer has particular application in vision areas of vehicles where luminous transmittance (LTA) requirements are greater than 70 percent, and durable, neutral appearing, antireflecting, solar enhanced glazing is required. Higher luminous transmittance (LTA) requirements, for example the European requirement of 75%, can be met by reducing the layer thickness of titanium nitride, which can also be done to compensate for the lower transmittance when tinted glass substrates are coated in accordance with the present invention.

Combinations of oxide, nitride and oxynitride layers may also be used as overcoats, however, in areas that do not have LTA requirements of greater than 70 percent. Silicon nitride or combinations of oxide, nitride or oxynitride as overcoat layers offer durable coatings with increased flexibility in the choice of color and reflectance. These overcoats have particular application for privacy glazing with enhanced solar properties.

The preferred coated articles of the present invention have the general configuration glass/M1/M3/silicon(M2)dielectric where M1 is a semiconductor or metal alloy or-combination thereof, M2 is an element combined with silicon in the silicon alloy target, and M3 is the metallic metal compound to be protected from oxidation and stabilized during high temperature processing such as tempering. An optional intermediate layer may be deposited between the metal compound and the silicon-based dielectric material.

With reference to FIG. 1, a glass substrate (10) is coated by sputtering, first, a stabilizing layer (20) whose function is to prevent coating breakdown during high temperature processing. This is followed by a metallic metal compound layer (30) width metallic properties whose function is primarily to reduce solar heat load, and secondarily to fulfill aesthetic requirements. This layer may be followed by an optional intermediate layer (not shown) the function of which is to enhance, if needed, the performance of the protective overcoat and, optionally, to give increased flexibility in coating aesthetics and transmittance. Following this layer is the dielectric protective overcoat layer (40) whose function is to prevent oxidation of the metallic compound layer during high temperature processing and to provide a durable overcoat.

The stabilizing layer is preferably selected from the group consisting of silicon, titanium, zirconium, tantalum, chromium, niobium, silicon alloys, nickel-chromium alloys and aluminum nitride. The metal compound layer (30) with metallic properties, the function of which is primarily to reduce solar heat load and secondarily to provide aesthetics requirements, is selected from the group consisting of metal borides, metal nitrides, metal carbides and metal oxynitrides. The optional intermediate layer is preferably selected from the group consisting of silicon, titanium, silicon metal alloys and oxides, nitrides and oxynitrides thereof. Finally, the dielectric protective overcoat layer (40), the function of which is to prevent coating breakdown during high temperature processing and to provide a durable overcoat, is selected from the group consisting of nitrides, oxides and oxynitrides of silicon and silicon-metal alloys.

Additionally, to provide flexibility in controlling color, reflectance and transmittance along with meeting solar property requirements, optional layers can be sputtered. For example, a silicon nitride layer can be inserted between the stabilizing layer (20) and the metallic metal compound layer (30). Other optional layer sequences are stacking the metallic metal compound layers alternatively with the group selected for the stabilizing layer and, adding a metal layer over the protective overcoat layer (40). Layers can also be repeated, for example, additional metallic metal compound layer followed by protective overcoat layer can be sputtered over the protective overcoat layer (40).

In preferred embodiments of the present invention, the coatings are produced on a large-scale magnetton sputtering device capable of coating glass up to 100×144 inches (2.54×3.66 meters). In the following examples, the coatings are deposited on a smaller scale, using planar magnetton cathodes having 5×17 inch (12.7×43.2 centimeter) metal targets of e.g. titanium, or a 3 inch (7.6 centimeter) diameter rotating cathode of silicon or silicon alloy. Base pressure is in the $10^{-6}$ Torr range.

The coatings are made by first admitting the sputtering gas to a pressure of 4 millitorr and then setting the cathode to a constant power. In each example, except where noted otherwise, 6 millimeter thick glass substrates pass under the targets on a conveyor roll at a speed of 120 inches (3.05 meters) per minute unless otherwise specified. This procedure is repeated for each layer in the configuration.

The coatings are tested for thermal stability by hanging 2×12 inch (5.1×30.5 centimeter) strips of coated 6.0 mm clear glass on tongs and lifting them into a 48×30×12 inch (1.2×0.76×0.3 meter) vertical "loft" furnace heated to 705° C. The strips are heated for 3.5 minutes, except where noted otherwise, to simulate tempering. Air quenching in the tempering process does not cause any coating degradation. To determine compatibility with a production process, coated glass plates 12 inches (0.3 meter) square were edged, washed, screened with a black band frit and tempered on vertical and horizontal furnaces. The coating properties were checked for transmittance, reflectance, color, and the solar properties of total solar energy transmittance and total solar infrared transmittance (TSET and TSIR). Taber abrasion tests were performed and percent haze recorded.

The invention will be further understood from the descriptions of specific examples which follow.

EXAMPLE 1

A titanium layer is deposited by sputtering a planar titanium cathode in argon at 0.6 kilowatts, 332 volts, to a transmission of 62 percent (1 pass), followed by 9 passes using a planar titanium cathode in pure nitrogen at 4.0 kilowatts, 536 volts, to a transmission of 18.5 percent, followed by 5 passes using a rotating cathode with silicon-5% aluminum in pure nitrogen at 2.8 kilowatts, 473 volts to a transmission of 23 percent. The coating thicknesses for each individual layer in Angstroms are 25 Angstrome titanium, 400 Angstroms titanium nitride and 270 Angstroms silicon-5% aluminum nitride. The properties on clear glass, before and after heating, are the following:

| | | C.I.E. CHROMATICITY COORDINATES (1931 2 degree observer) | |
|---|---|---|---|
| | | Unheated | Heated |
| | Reflectance (Illuminant D65) | | |
| Film Side | Y | 13.59% | 10.31% |
| | x | .357 | .3264 |
| | y | .3767 | .3411 |
| Glass Side | Y | 29.25% | 19.11% |
| | x | .3042 | .2945 |
| | y | .3366 | .3234 |
| Transmittance (Illuminant A) | | | |
| | Y | 24.11% | 34.7% |
| | x | .4479 | .4387 |
| | y | .4156 | .4165 |
| TSET | | 17.9% | 21.7% |
| TSIR | | 10.7% | 10.3% |

The transmitted total solar infrared radiation (TSIR) shows that the titanium nitride does not degrade after heating, but instead is slightly enhanced. This is also evident in the wavelength region greater than 900 nm where TSIR is up to 1 percent lower than the unheated sample. The abrasion resistance after heating is well below the required 2 percent haze limit for glass. The before heat scratch resistance is more than sufficient to survive the complete manufacturing tempering process (cutting, edging, washing, screening, and tempering) with no scratching or coating degradation. This coating applied to 4.0 millimeter solar-gray® glass for privacy glazing in automotive sidelights and backlights reduces luminous transmittance to approximately 20 percent and total solar transmittance to 13 percent.

EXAMPLE 2

The first layer is deposited by sputtering a planar silicon-7.5% nickel cathode in argon at 0.4 kilowatts, 500 volts, to a transmission of 81.4 percent (1 pass), followed by 1 pass at 90 inches (2.3 meters) per minute using a planar titanium cathode in pure nitrogen at 6.0 kilowatts, 596 volts, to a transmission of 53.7 percent, followed by 12 passes using a planar cathode with silicon-7.5% nickel in a 50 percent argon-50 percent oxygen gas mixture at 3.0 kilowatts, 348 volts to a transmission of 63.2 percent. The coating thicknesses for each individual layer are 23 Angstroms of silicon-7.5% nickel, 100 Angstroms of titanium nitride and 790 Angstroms of silicon-7.5% nickel oxide. The properties on 6.0 millimeter clear float glass before heating (Unheated) and after heating at 1300° F. (704° C.) for 3.5 minutes (Heated) as illustrated in FIG. 2 are the following:

| C.I.E. CHORMATICITY COORDINATES (1931 2 degree observer) | | | |
|---|---|---|---|
| | | Unheated | Heated |
| | Reflectance (Illuminant D65) | | |
| Film Side | Y | 3.28 | 3.02 |
| | x | .3350 | .3068 |
| | y | .3187 | .3443 |
| Glass Side | Y | 13.25 | 9.51 |
| | x | .3102 | .3037 |
| | y | .3388 | .3323 |
| Transmittance (Illuminant A) | | | |
| | Y | 63.21 | 70.88 |
| | x | .4511 | .4431 |
| | y | .4140 | .4120 |
| | TSET | 52.56 | 55.26 |
| | TSIR | 43.84 | 40.38 |

Figure 2:
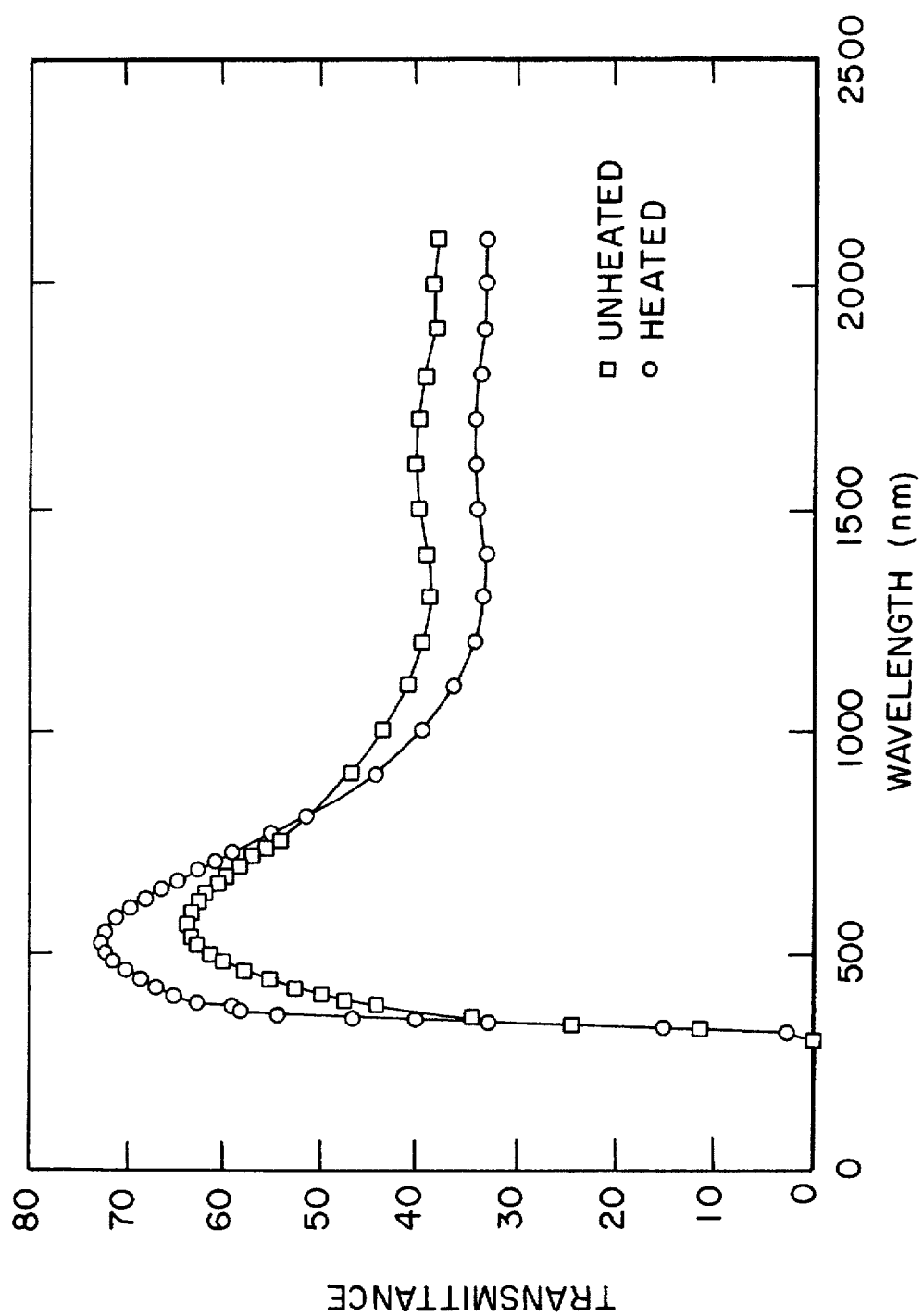
FIG. 2 illustrates the transmittance as a function of wavelength for a coating of the present invention before and after heating at 1300° F. (704° C.) for 3.5 minutes.

FIG. 2 shows the percent transmittance as a function of wavelength (in nanometers) in the solar region of the spectrum both before and after heating. These data show that the transmittance increases in the visible but decreases in the infrared after heating thus enhancing the total solar performance of the coating.

When this coating is deposited on heat absorbing glass such as Solex® glass, the titanium nitride layer is reduced to 45 Angstroms for 4.0 mm Solex glass to meet the 70 percent (Illuminant A) transmittance requirement. The solar properties of this coating on 4.0 mm Solex glass after heating for 1.75 minutes at 1300° F. are TSET=47.78 percent and TSIR=27.67 percent for an Illuminant A transmittance of 71.03 percent.

The resulting coating is antireflecting from the film side and has neutral appearance in both transmittance and reflectance. The transmittance (Illuminant A) is maximum and TSET minimum for silicon-7.5% nickel oxide thicknesses in the range from 790 Angstroms (12 passes) to 925 Angstroms (14 passes) with titanium nitride thicknesses less than or equal to 100 Angstroms.

The silicon-7.5%. nickel layer described in this example (0.4 kilowatt) is the minimum thickness for a stable coating after tempering. Coating breakdown, as described earlier, will occur rapidly for thinner layers. Onset of coating breakdown can be seen as the transmission drops as the primer layer is decreased. On the other hand, the coating will not meet the required light transmission of 70 percent or greater (Illuminant A) if the primer layer is sputtered at greater than 0.7 kilowatts (40 Angstroms). Generally, if this layer is sputtered at 0.6 kilowatts, 525 volts, resulting in 73 percent transmission on 6.0 millimeter clear glass after 1 pass (34 Angstroms), the coating will be stable with transmission above 70 percent (Illuminant A).

EXAMPLE 3

A coated article prepared as in Example 2, but having the configuration glass/Si-5%Al/Ti nitride/Si-5%Al nitride is stable with tempering with a Si-5%Al thickness greater than or equal to 25 Angstroms for a Si-5%Al nitride layer greater than or equal to 125 Angstroms.

EXAMPLE 4

A coated article prepared as in Example 3, but having the configuration glass/Si-8%Fe-0.25%B/Ti nitride/Al nitride/Si-8%Fe-0.25%B nitride is stable with tempering with a Si-8%Fe-0.25%B thickness of 25 Angstroms, aluminum nitride thickness of 80 Angstoms, and a Si-8%Fe-0.25%B nitride thickness of 200 Angstroms. Although aluminum nitride dissolves in water, for a coating with the above configuration, the unheated coating survives boiling in water for 30 minutes and is stable with tempering. The heated coating also survives boiling for 30 minutes. Si-8%Fe-0.25%B is used when absorption is desirable in the coating, for example in privacy glazing.

EXAMPLE 5

A coated article is prepared as in the previous examples, having the configuration glass/Si-8%Fe-0.25%B/Ti nitride/Si-8%Fe-0.25%B/Si-8%Fe-0.25%B nitride. The coating is stable with tempering for Si-8%Fe-0.25%B thicknesses of 25 Angstroms and Si-8%Fe-0.25%B nitride thickness of 350 Angstroms. The additional layer gives increased flexibility in varying color, transmittance and reflectance in addition to thermal stability.

EXAMPLE 6

Coatings are prepared as in the previous examples, having the configuration glass/Ti/Ti nitride/Si-13%Al nitride or oxynitride. These coatings illustrate the differences between the Si-M2 nitride and oxynitride overcoats. Both of these coatings are stable with tempering. The first three layers of both coatings are made by sputtering on 6 millimeter clear glass the layers as described in Example 1, except the 9 passes of the titanium nitride layer were sputtered at 4.4 kilowatts, 543 volts to a transmission of 16.5 percent. The thickness of the titanium nitride layer was 40 Angstroms. Both overcoat layers were then sputtered to the same physical thicknesses of 220 Angstroms. The Si-13%Al nitride overcoat layer was made by sputtering 5 passes from a planar cathode in pure nitrogen at 3.0 kilowatts, 456 volts to a final transmission of 19.7 percent. The Si-13%Al oxynitrtde layer was made by sputtering 5 passes from the same planar cathode in a 6 percent oxygen—nitrogen mix at 2.6 kilowatts, 450 volts to a final transmission of 18.9 percent. The CIE color coordinates were then compared for the coating after heating on both the film and glass sides.

| | | Reflectance | Nitride | Oxynitride |
|---|---|---|---|---|
| Film Side | Y(D65) | | 12.08% | 15.42% |
| | x | | .3292 | .3341 |
| | y | | .3311 | .3288 |
| Glass Side | Y(D65) | | 20.2% | 17.94% |
| | x | | .2973 | .2977 |
| | y | | .3219 | .3114 |

From the above results it can be seen that as the overcoat with constant physical thickness goes from nitride to oxynitride there is a color shift and change in reflectance due to change in the coating index.

EXAMPLE 7

A coated article prepared as in the previous examples having the configuration glass/Si-7.5%Ni/Ti nitride/Si-10%Cr nitride is stable after tempering, for example, with the Si-10%Cr nitride layer in the thickness range 290 Angstroms to 1050 Angstroms for titanium nitride layer thickness of 100 Angstroms and Si-7.5%Ni layer thickness of 34 Angstroms.

The first two layers of this coating are made by sputtering on 6.0 millimeter clear glass as described in Example 2. The third layer is made by sputtering 4 passes from a planar Si-10%Cr cathode in pure nitrogen at 3.0 kilowatts, 510 volts to a final transmission of 53.1 percent. The thickness of this layer is 290 Angstroms.

The above examples are offered only to illustrate the present invention. Other metal nitride, metal carbide and metal boride metallic films and composition ranges may be used as the metallic metal compound layer. Other oxide, oxynitride and nitride layers may be used as the protective overcoat, and other stabilizing metal layers may be used. Deposition conditions will vary according to equipment and material being deposited. Coating thicknesses can be varied to produce the desired reflectance and transmittance properties. The scope of the present invention is defined by the following claims.

We claim:

1. A method of making a tempered coated article having a metallic appearance comprising the steps of:
   depositing on a surface of a glass substrate a stabilizing metallic film selected from the group consisting of titanium, zirconium, tantalum, chromium, niobium, nickel-chromium alloys and aluminum nitride;
   depositing a metal compound film on the stabilizing film;
   depositing a protective layer comprising a silicon or silicon alloy dielectric over the metal compound film to prevent oxidation of the metal compound film upon heating; and
   heating the glass substrate having the stabilizing metallic film, the metal compound film and the protective layer defined as a coated substrate to a temperature sufficient to temper the glass substrate, to increase the transmission of the coated substrate in the wavelength range of 400–800 nanometers, to decrease solar transmission of the coated substrate in the wavelength range of 800 to 2100 nanometers and to oxidize the stabilizing metallic film.

2. The method according to claim 1, wherein said metal compound film is selected from the group consisting of metals, metal borides, metal nitrides, metal carbides and metal oxynitrides.

3. The method according to claim 2, wherein the metal compound film is selected from the group consisting of chromium nitride, titanium nitride, titanium boride, titanium carbide, zirconium nitride, hafnium nitride, tantalum nitride, niobium nitride, titanium oxynitride, zirconium oxynitride, chromium oxynitride, hafnium oxynitride, tantalum oxynitride, and niobium oxynitride.

4. The method according to claim 1, wherein said protective layer is selected from the group consisting of the nitrides, oxides and oxynitrides of silicon and silicon-metal alloys.

5. The method according to claim 4, wherein said protective layer is selected from the group consisting of silicon oxide, silicon nitride, silicon oxynitride, silicon-nickel oxide, silicon-nickel nitride, silicon-nickel oxynitride, silicon-aluminum oxide, silicon-aluminum nitride, silicon aluminum oxynitride, silicon-iron oxide, silicon-iron nitride, silicon-iron oxynitride, silicon-chromium nitride, silicon-chromium oxynitride, silicon-nickel-chromium oxide, silicon nickel-chromium nitride, silicon-nickel-chromium oxynitride, silicon boron oxide, silicon boron nitride and silicon boron oxynitride.

6. The method according to claim 1, further comprising the step of depositing an additional layer between said metal compound film and said protective layer.

7. The method according to claim 6, wherein said additional layer is selected from the group consisting of silicon, titanium, a silicon-metal alloy, nitrides, oxides and oxynitrides thereof.

8. The method according to claim 7, wherein the additional layer is selected from the group consisting of aluminum nitride, silicon and silicon-metal alloys.

9. The method according to claim 1, wherein the coated glass substrate is heated to a temperature of about 700° C. and is tempered.

10. The method according to claim 1, wherein the glass substrate is a tinted glass.

11. The method according to claim 1, wherein said metal compound film is selected from the group consisting of metal borides, metal carbides and metal oxynitrides.

12. The method according to claim 1, wherein said protective layer is selected from the group consisting of the nitrides and oxynitrides of silicon and silicon-metal alloys.

13. The method according to claim 12, wherein said protective layer is selected from the group consisting of silicon nitride, silicon oxynitride, silicon-nickel oxide, silicon-nickel nitride, silicon-nickel oxynitride, silicon-aluminum nitride, silicon aluminum oxynitride, silicon-iron oxide, silicon-iron nitride, silicon-iron oxynitride, silicon-chromium nitride, silicon-chromium oxynitride, silicon-nickel-chromium oxide, silicon-nickel-chromium nitride, silicon-nickel-chromium oxynitride, silicon-boron oxide, silicon boron nitride and silicon boron oxynitride.

14. The method according to claim 1, wherein the metal compound film is niobium nitride.

15. The method according to claim 1, wherein said protective layer is selected from the group consisting of the nitrides, and oxynitrides of silicon and silicon metal alloys.

16. The method according to claim 1, wherein said protective layer is selected from the group consisting of silicon nitride, silicon oxynitride, silicon-nickel oxide, silicon-nickel nitride, silicon-nickel oxynitride, silicon-aluminum nitride, silicon aluminum oxynitride, silicon-iron oxide, silicon-iron nitride, silicon-iron oxynitride, silicon-chromium nitride, silicon-chromium oxynitride, silicon-nickel-chromium oxide, silicon-nickel-chromium nitride, silicon-nickel-chromium oxynitride, silicon-boron oxide, silicon boron nitride and silicon boron oxynitride.

17. The method according to claim 1, wherein the step of depositing a stabilizing metallic film includes the step of sputtering a stabilizing metallic film on the surface of the glass substrate and the step of depositing a metal compound film includes the step of sputtering a metal compound film.

18. The method according to claim 17, wherein the metal compound film is selected from the group consisting of titanium boride, titanium carbide, titanium oxynitride, zirconium oxynitride, chromium oxynitride, hafnium oxynitride, tantalum oxynitride, and niobium oxynitride.

19. The method according to claim 18, wherein the protective layer is selected from the group consisting of the nitrides and oxynitrides of silicon and silicon-metal alloys.

20. The method according to claim 19, wherein said protective layer is selected from the group consisting of silicon oxide, silicon nitride, silicon oxynitride, silicon-nickel oxide, silicon-nickel nitride, silicon-nickel oxynitride, silicon-aluminum nitride, silicon aluminum oxynitride, silicon-iron oxide, silicon-iron nitride, silicon-iron oxynitride, silicon-chromium nitride, silicon-chromium oxynitride, silicon-nickel-chromium oxide, silicon-nickel-chromium nitride, silicon-nickel-chromium oxynitride, silicon-boron oxide, silicon boron nitride and silicon boron oxynitride.

21. The method according to claim 1, wherein the stabilizing metallic film is selected from the group consisting of nickel-chromium alloys and aluminum nitride.

22. The method according to claim 22, wherein said metal compound film is selected from the group consisting of metal borides, metal carbides and metal oxynitrides.

23. The method according to claim 22, wherein said protective layer is selected from the group consisting of the nitrides and oxynitrides of silicon and silicon-metal alloys.

24. The method according to claim 21, wherein the metal compound film is selected from the group consisting of titanium boride, titanium carbide, titanium oxynitride, zirconium oxynitride, chromium oxynitride, hafnium oxynitride, tantalum oxynitride, and niobium oxynitride.

25. The method according to claim 24, wherein said protective layer is selected from the group consisting of silicon nitride, silicon oxynitride, silicon nickel oxide, silicon-nickel nitride, silicon-nickel oxynitride, silicon-aluminum nitride, silicon aluminum oxynitride, silicon-iron oxide, silicon-iron nitride, silicon-iron oxynitride, silicon-chromium nitride, silicon-chromium oxynitride, silicon-nickel-chromium oxide, silicon-nickel-chromium nitride, silicon-nickel-chromium oxynitride, silicon-boron oxide, silicon boron nitride and silicon boron oxynitride.

26. The method according to claim 21, wherein said protective layer is selected from the group consisting of the nitrides, oxides and oxynitrides of silicon and silicon-metal alloys.

* * * * *

UNITED STATES PATENT AND TRADEMARK OFFICE
CERTIFICATE OF CORRECTION

PATENT NO. : 5,552,180
DATED : September 3, 1996
INVENTOR(S) : James J. Finley, Mehran Arbab and Thomas J. Waynar It is certified that error appears in the above-indentified patent and that said Letters Patent is hereby corrected as shown below:

Col. 10, Claim 12, line 1, delete "1" and insert --11--.
Col. 11, Claim 22, line 1, delete "22" and insert --21--.

Title page item [54] and col. 1, should read-- Method of Making a Tempered Coated Article--.

Signed and Sealed this

Fourth Day of February, 199

Attest:

BRUCE LEHMAN

*Attesting Officer*

*Commissioner of Patents and Trademarks*